United States Patent [19]
Guo et al.

[11] Patent Number: 5,752,180
[45] Date of Patent: May 12, 1998

[54] CONVERTER FOR PROCESSING RF SIGNALS HAVING DIFFERENT POLARIZATIONS

[75] Inventors: Chaoying Guo; Jean-Paul Grimm, both of Illkirch, France

[73] Assignee: Thomson Consumer Electronics S.A., Courbevoie, France

[21] Appl. No.: 544,899

[22] Filed: Oct. 18, 1995

Related U.S. Application Data

[63] Continuation of Ser. No. 189,002, Jan. 27, 1994, abandoned.

[30] Foreign Application Priority Data

Jan. 30, 1993 [EP] European Pat. Off. .............. 93101481

[51] Int. Cl.$^6$ ........................................ H04B 1/26
[52] U.S. Cl. .................... 455/319; 455/3.2; 455/333; 342/362
[58] Field of Search ........................ 455/317, 319, 455/321, 324–327, 331–333, 136, 141, 208, 209, 3.2, 318; 342/361, 362

[56] References Cited

U.S. PATENT DOCUMENTS

| | | | |
|---|---|---|---|
| 3,810,038 | 5/1974 | Hershberg et al. | 455/141 |
| 4,219,779 | 8/1980 | Shinkawa et al. | 455/333 X |
| 4,541,123 | 9/1985 | Saka | 455/327 X |
| 4,554,680 | 11/1985 | Jacobs et al. | 455/326 |
| 4,658,440 | 4/1987 | Pavior et al. | 455/319 |
| 5,263,182 | 11/1993 | Park | 455/3.2 |

FOREIGN PATENT DOCUMENTS 0 289 617  11/1988  European Pat. Off. .......... H04B 1/10

OTHER PUBLICATIONS

Patent Abstract of Japan, Pub. No. JP63164702 Jul. 8, 1988, Abstract vol. No. 012430 App. No. JP860312265.
On The Design Of A Voltage–Tuned Push–Push Dielectric Resonator Oscillator. Cheh–Ming Llu et al, Microwave Journal, Jun. 1980 pp. 164 to174.
A 20–40 GHz Push–Push Dielectric Resonator Oscillator, A.M. Pavio et al IEEE Transactions On Microwave Theory And Techniques vol. MTT–33 No.12 Dec. 1985.
MIC Assembly For 12 GHz Direct Broadcast Satellite Receiver, Gu Molin et al, 1985 IEEE MTT–S Digest, pp. 107–110.
Dual LNB zur Installation von kleinen Gemeinschaftsanlagen, Bel–Tronics Limited, Model DLNB 2300.
Radio Frequency Systems Hannover Division of kabelmetal electro GmbH, SATCOM Antenna Systems.

*Primary Examiner*—Edward F. Urban
*Attorney, Agent, or Firm*—Joseph S. Tripoli; Peter M. Emanuel

[57] ABSTRACT

A radio frequency converter includes a plurality of signal paths for simultaneously processing two RF signals in the same band but with different polarizations, each of which includes a mixer and an oscillator. A common resonator is connected to the frequency control terminal of each of the oscillators and the oscillators work in a push-push configuration.

6 Claims, 1 Drawing Sheet

CONVERTER FOR PROCESSING RF SIGNALS HAVING DIFFERENT POLARIZATIONS

This is a continuation of application Ser. No. 08/189,002 filed Jan. 27, 1994, now abandoned.

BACKGROUND OF THE INVENTION

The present invention relates to a converter which is part of a reception system preferably for the reception of microwave signals.

It is generally known to convert incoming radiofrequency (RF) signals to an intermediate frequency with a frequency value which is normally lower than the one of the incoming signal. For such a conversion there are, beside some other components such as amplifiers, filters and thelike, mixers and according oscillators provided.

For some applications, such as for the reception of a directly transmitted satellite broadcast signal by a so-called DBS system, it is useful or even necessary to receive simultaneously two incoming signals. In the case of a DBS system this can be the reception e.g. of two signals with different polarizations.

A typical todays converter includes 50 to 100 components, such as transistors, diodes, resistors, capacitors, soldered on a circuit board. The recent processes of the technology allow today most of these components to be integrated into one single monolithic microwave integrated circui, hereafter referred to as MMIC. Two elements are generally not included in a converter MMIC:

- the first one is the low noise preamplifier (LNA) which needs smaller noise figure than can be achieved in MMIC technology. But one can expect that this one will be overcome in a few years;
- the second one is the frequency stabilizing element of the oscillator.

A converter needs a very stable oscillator—typically the frequency must stay within

±0.01% of its nominal value. It is known to stabilize a microwave oscillator with a dielectric resonator (DR) placed in a cavity and coupled to the oscillators active device e.g. by a microstrip line crossing the cavity nearby the resonator. The active device may be inside the cavity. The DR and its cavity are in the order of 10 times larger than the MMIC and its package.

If there are two signal paths for the simultaneous reception of different signals of the same frequency bands, it is necessary to adjust the two MMIC-oscillators to have the same local frequency. Using two external dielectric resonators this is quite difficult.

It is also possible to connect the frequency control terminals of the MMIC-oscillators to the output of an external dielectric resonator oscillator (DRO). The MMIC are then injection-locked, this means they have exactly the same frequency. But such a DRO is relatively expensive.

It is further possible to stabilize a first MMIC-oscillator by the aid of a dielectric resonator, to take a small part of the oscillators power, to amplify it and to injection-lock the second MMIC-oscillator to this signal. But the additional amplifier results in an increased production cost.

It is further known, e.g from the article "A 20–40-GHz Push-Push Dielectric Resonator Oscillator", A. M. Pavio, M. A. Smith, IEEE Transactions on Microwave Theory and Techniques, Vol. Mit 33, No 12, December 1985, pages 1346–1349, and from the article "On the Design of a Voltage-Tuned Push-Push Dielectric Resonator Oscillator", C-M Liu, C. Y. Ho, Microwave Journal June 1990, pages 165–174 to realise an oscillator having two identical sub-oscillators which are arranged in a push-push configuration and which are thereby stabilized by just one dielectric resonator. The common oscillator has thereby the frequency of oscillation that is twice the frequency of each individual sub-oscillator.

SUMMARY OF THE INVENTION

It is an object of the present invention to present a converter system for the simultaneous reception of two signals in the same frequency range which is simple to realise.

This can be realised by a converter according to claim 1.

A converter system according to the present invention has two signal paths each of them including a mixer and an according oscillator, which can be stabilized by a dielectric resonator (DR). The said mixer and the oscillator, as well as additional amplifier and filters, can be integrated e.g. in a monolithic microwave integrated circuit (MMIC). This invention is characterised in that only one DR is used for both oscillators. This is realised by a so-called push-push oscillator configuration.

This push-push configuration for a converter can be used e.g. for a direct broadcasting satellite (DBS) system. These systems are normally fabricated by a mass-production. By using just one dielectric resonator and avoiding the use of additional components, such as an amplifier, the production costs can be reduced essentially.

BRIEF DESCRIPTION OF THE DRAWINGS

Further advantages, details and characteristics are explained with the aid of preferred embodiments where.

DESCRIPTION OF THE PREFERRED EMBODIMENTS

Figure 1:
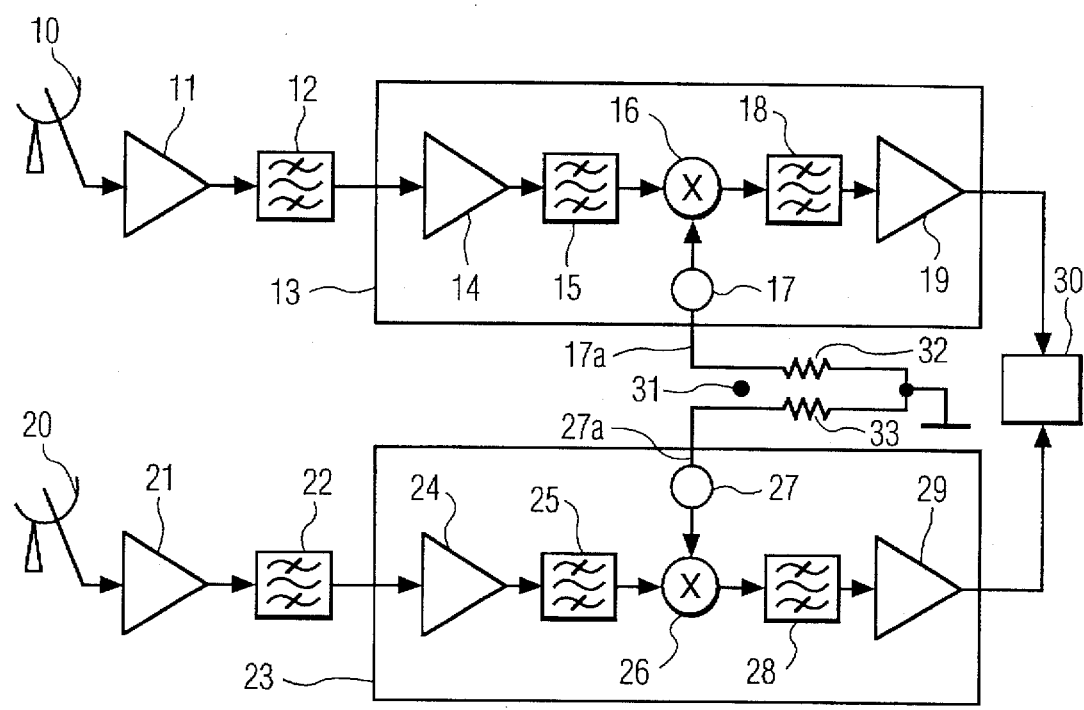
FIG. 1 shows a block diagram of a preferred embodiment and FIG. 2 shows a schematic circuit diagram of oscillators used in the embodiment of FIG. 1.

The block diagram in FIG. 1 shows a converter having two signal paths. The first path on the upper half of FIG. 1 receives signals from a first microwave antenna 10, which can be a parabolic reflector with a feeder horn, a helical antenna working in the axial backfire or endfire mode, or which can even be a dielectric antenna, such like a Luneburg-type one with an according feed, or any other kind of antenna. The antenna signal is amplified by a first low noise amplifier (LNA) 11 which gives its output signal via a first bandpass-filter 12 to a first monolithic microwave integrated circuit (MMIC) 13.

A second signal path, shown in the lower half of FIG. 1, receives signals from a second microwave antenna 20, which can be the same type as the first antenna 10, or from a second output of the single antenna. The according antenna signal is amplified by a second LNA 21. Output signal of this LNA 21 is led via a second bandpass filter 22 to a second MMIC 23.

The output signals of the MMICs 13, 23 are led to further stages for processing these signals. These stages are indicated by the block 30 and may include beside amplifiers, filters and thelike according devices for generating pictures and/or sound, information of which is given by the signals received by the antennas 10, 20. The block 30 may also include devices for processing digital data for a computer, teletext data or thelike.

The signals received by the antennas 10, 20 are signals in the same frequency bands. These signals may come e.g. from different sources, like from the satellite TDF 1 or 2 and from the satellite TV-SAT or the signals may be from the same source, e.g. like from the satellite ASTRA, with different polarisations. In this case according polarisation selection means are to be provided.

The MMIC 13 includes a third LNA 14, which gives its output signals to a first image and local oscillator rejection filter 15. An accordingly filtered signal is led to a first mixer 16 which is connected with a first local oscillator 17. The output of the mixer 16 is an intermediate frequency (IF) signal which is filtered by a further filter 18 and amplified by an IF amplifier 19.

The second MMIC 23 includes stages of the same type as the MMIC 13 and means 24, 25, 26 . . . have the same function as the means 14, 15, 16, . . . .

Microstrip lines 17a, 27a are connected in such a way with the oscillator 17 or 27 respectively and are led through the area of a dielectric resonator (DR) 31 such that the oscillators work in a push-push configuration. The lines 17a, 27a are terminated via resistors 32, 33 respectively.

Figure 2:
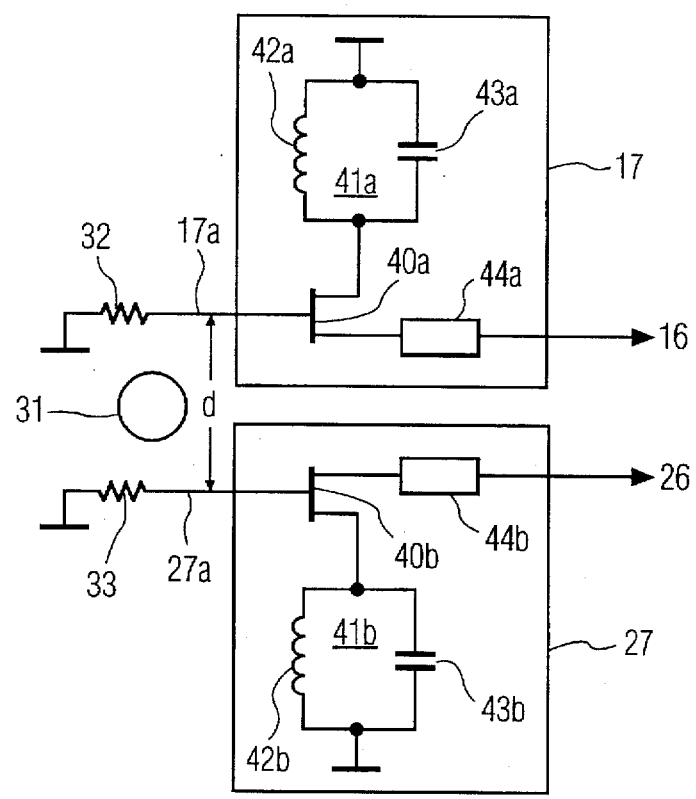

FIG. 2 shows a part of a block diagram with preferred schematic circuit diagrams of the oscillators 17 and 27. Each of the oscillators 17, 27 includes an active device 40a, 40b respectively, which is in this embodiment a metal semiconductor field-effect transistor (MESFET). The gate terminals of the MESFETs 40 are connected with the microstrip lines 17a, 27a respectively. The source terminal of each of the MESFETs 40 is connected with a L/C feedback circuit 41a, 41b respectively, each including an inductance 42a, 42b respectively and a capacitor 43a, 43b respectively. The drain terminals of the MESFETs 40 are connected via matching circuits 44a, 44b respectively with the mixers 16, 26.

The DR 31 is placed adjacent to the microstrip lines 17a, 27a. These lines may be parallel, but this is not a necessary condition. Any other angle would just result in a different phase relation between the voltages in the two oscillators.

In order to get a concrete understanding of the push-push oscillators used in these embodiment, first a description of a single oscillator, as shown in the upper part of FIG. 2, is given.

The dielectric resonator 31 adjacent to the microstrip line 17a, terminated in a resistor 32 equal to its characteristic impedance, operates as a resonator which reflects the radiofrequency (RF) energy at the resonant frequency. Since the quality factor of the dielectric resonator 31 is very high, the loss in the resonator is very small. The phase of the reflection coefficient has a very sharp frequency dependence near to the resonance frequency.

The active device 40a, which can be e.g. a FET or a MESFET, must be capable of oscillation at the design frequency. The feedback circuit 41a is chosen to ensure that the stability factor is less than unity, this means that the circuit is unstable.

The gate input impedance Za of the active device 40a with its feedback and matching networks 41a, 44a is:

$$Za=(-)Ra+j*Xa$$

where

Ra is the real part of the impedance (negative at the design frequency); and

Xa is the imaginary part of the impedance.
The resonator position and coupling coefficient are chosen to have $$Zi+Za=0$$

at the resonant frequency of, where Zi is the input impedance looking into the DR 31 and its load at the same reference plane as Za.

Let us now consider the DR 31 placed between two microstrip lines 17a, and 27a each terminated in resistor 32, 33 equal to the caracteristic impedance of these lines (see FIG. 2).

At frequencies different from the resonant frequency, everything is exactly as if there were no DR at all.

At frequencies near to the resonant frequency, energy fed into line 17a, is almost completely reflected, but a small portion of this energy is transmitted to the second microstrip line 27a with a phase depending on the relative position of these lines, and vice versa.

Let us assume that there is just a single oscillator, e.g. like shown in the upper part of FIG. 2. If a second microstrip line and other parts are added on the opposite side of the resonator, but without biasing the second active device 40b, some energy is taken out of the oscillator 17 by the circuit 27. This will cause the amplitude of the oscillation to decrease, or the oscillation might even stop.

The same explanation can be given for the opposite case, where the bias of the first active device 40a is removed and the active device 40b is biased. Since the circuit is symmetric, the second oscillator 27 will oscillate while the first oscillator 17 will absorb a small part of its power. The oscillation frequency will be slightly different compared to the case of non-added means of the opposite side of the DR 31 because of the non-perfect symmetry.

For the following explanation both active devices 40a, 40b are biased simultaneously. One can imagine, applying the principle of superposition, that each oscillator will oscillate at its own frequency. But the reality is not exactly like this: Depending in the instantaneous phase relation between the voltages at the respective inputs of the two active devices 40a, 40b, the second half of the oscillator will not be seen as a load by the first oscillator. For given relative phases, the second oscillator helps amplifying the oscillation, while for the opposite phases, the second oscillator tends to stop the first oscillation. Practically, this means that the two oscillators 17, 27 synchronise or phase-lock to each other.

As a result the outputs of the push-push oscillator are two signals with the same amplitude and exactly the same frequency.

The phase relation depends on the symmetry of the circuit:

opposite phase if the circuit is symmetric with respect to a line;

same phase if the circuit is symmetric with respect to a point (center of the resonator);

arbitrary phase difference if the circuit is not symmetric.

Knowing that in the case of a symmetric construction all voltages and currents at corresponding points of both sub-oscillators are exactly the same or opposite, makes the design of the push-push oscillator very simple: If the coupling coefficient between DR 31 and the microstrip lines 17a, 27a is correctly chosen as exactly two times smaller than that of a single dielectric resonator oscillator (DRO), the push-push circuit can be designed by analyzing only one half of the circuit.

Because the phase of oscillator outputs is not important for an application in a direct broadcasting satellite (DBS) system, both circuits can be chosen in such case. Since the solution shown in FIG. 2 is symmetric and hence it is easier to be adjusted, this arrangement is preferred, though the output signals are of opposite phase.

The correct coupling between the DR 31 and the microstrip lines 17a, 27a can be chosen by experimental way. Three circuits have been tested with different distances d between the microstrip lines 17a, 27a. The MMIC used for these tests was an ANADIGICS AKD 12011 and the used DR was a MURATA DR with

| diameter of the DR | Dr = 5.06 mm, |
|---|---|
| thickness of the DR | Lr = 2.24 mm, |
| relative dielectric constant | Er = 38, |
| temperature coefficient | tf = 4 ppm/°C. |

Table 1 gives the measured results.

TABLE 1

|   |   | noise figure (dB) | gain (dB) |
|---|---|---|---|
| 1. | d = do | 7.4 | 37 |
| 2. | d = do + 0.4 mm | 7.2 | 37.5 |
| 3. | d = do − 0.4 mm | 8 | 35. |

As the circuit 2 gave the best results further tests were made with it in the temperature range from −30° C. to 60° C. This gave the results as presented by table 2.

TABLE 2

| noise fig. (NF) at 25° C. | 7.2 dB |
|---|---|
| gain (G) at 25° C. | 37.5 dB |
| NF sensibility | 0.0145 dB/° C. |
| G sensibility | 0.0076 dB/° C. |
| frequency stability | −1.2 to +1.1 MHz. |

By the preferred embodiment a push-push DR coupled MMIC circuit for simultaneous reception has been developed. It has the special advantages that the number of parts is smaller and that it is easily to be adjusted compared with known circuits.

By adding a high electron mobility transistor (HEMT) pre-amplifier and a bandpass filter both at each of input, a simultaneous reception low noise block (LNB), e.g. for a DBS system, can be constructed.

We claim:

1. A radio frequency (RF) converter apparatus for processing RF signals received from a satellite, including RF signals of the same frequency but with different polarizations comprising:

a plurality of signal paths for simultaneously receiving and processing respective ones of two of said RF signals in the same frequency band, but with different polarizations, each of said signal paths including a mixer and an oscillator for providing respective ones of two output intermediate frequency signals simultaneously, each of said oscillators having a frequency control line; and a resonator coupled with said frequency control line of each of said oscillators so that each of said oscillators oscillates at the same frequency.

2. The converter of claim 1 wherein each of said frequency control lines is a micro-strip line and said resonator is a dielectric resonator arranged in the proximity of said micro-strip lines.

3. The converter of claim 2 wherein said micro-strip lines are in parallel and said resonator is arranged between said micro-strip lines.

4. The converter of claim 2 wherein at least one pair of said mixers and oscillators is included in a monolithic microwave integrated circuit and wherein said converter is used for the reception of direct broadcast system signals (DBS).

5. The converter of claim 2 wherein said oscillators work in a push-push fashion.

6. The converter of claim 1 wherein said frequency control lines are in parallel and said resonator is arranged between said frequency control lines.

* * * * *